BULK NEGATIVE CONDUCTIVITY SEMICONDUCTOR OSCILLATOR

Filed Aug. 14, 1967 5 Sheets-Sheet 1

INVENTORS
JAMES C. MC GRODDY
MARSHALL I. NATHAN

BY [signature]
ATTORNEY 3,458,832
Patented July 29, 1969

3,458,832

BULK NEGATIVE CONDUCTIVITY SEMICONDUCTOR OSCILLATOR

James C. McGroddy, Putnam Valley, and Marshall I. Nathan, Mount Kisco, N.Y., assignors to International Business Machines Corporation, Armonk, N.Y., a corporation of New York Continuation-in-part of application Ser. No. 640,661, May 23, 1967. This application Aug. 14, 1967, Ser. No. 660,461
Int. Cl. H03b 5/12, 5/24
U.S. Cl. 331—107 15 Claims

ABSTRACT OF THE DISCLOSURE

The principal component of the oscillator is a body of germanium doped lightly with an N-type impurity. Ohmic connections are made to the semiconductor body which is oriented so that a voltage applied between these contacts is parallel to a (100) crystallographic direction in the germanium. A load and a voltage source are connected to the ohmic contacts to form the oscillator circuit. High frequency oscillations are obtained when the voltage across the body exceeds a threshold voltage ($V_1$) which is greater than that necessary to produce a saturated drift velocity in the body, but less than that necessary to cause complete avalanche breakdown to occur.

This is a continuation-in-part of copending application Ser. No. 640,661, filed on May 23, 1967 and now abandoned.

Field of the invention

This invention relates to semiconductor oscillators and more particularly to high frequency oscillators in which the oscillations are produced by current instabilities in the bulk of a semiconductor body. The oscillations do not require a junction nor the injection of minority carriers, but rather are produced in a single conductivity type body of a semiconductor material, such as germanium, by a phenomenon which involves the majority carriers in the body. More specifically, it has been discovered that germanium exhibits a bulk negative differential conductivity when subjected to sufficiently intense electric fields.

Prior art

The pertinent prior art is as follows.

(a) British Patent No. 849,476, by J. B. Gunn, published Sept. 28, 1960.

(b) U.S. Patent No. 3,215,826, issued Nov. 2, 1965 to E. Erlbach.

(c) An article entitled, "Observations of Instability in Semiconductors Caused by Heavily Injected Minority Carriers" by Makoto Kikuchi and Yutaka Abe, which appeared in the Journal of the Physical Society of Japan, vol. 17, p. 1268, August 1962.

(d) An article by J. B. Gunn entitled, "Instabilities of Current and of Potential Distribution in GaAs and InP" which appeared in Plasma Effects in Solids, Dunod, 1965, pp. 199–207.

(e) An article by J. A. Copeland entitled, "Theoretical Study of a Gunn Diode in a Resonant Circuit" which appeared in the IEEE Transactions for Electron Devices, vol. ED–14, p. 55, February 1967.

Each of the devices described in the above cited prior art can be employed to produce high frequency oscillations with the use of a body of semiconductor material in which the phenomenon employed to realize the oscillations occurs in the bulk of the material.

The germanium device described in the British patent of Gunn, cited above, is one in which a high field is applied across a body of N-type germanium to produce avalanche breakdown and the injection of minority carriers through the bulk of the material. This produces a negative resistance characteristic in the body which can be used in combination with an appropriate load to generate oscillations. It should be emphasized that in this patent, the suggested oscillations are not produced in the semiconductor body itself. Rather, it is suggested that conventional circuit techniques can be used to combine the negative resistance characteristics of the body with an appropriate load to produce oscillations.

In the device of the Erlbach patent a negative resistance characteristic is realized in the bulk of a semiconductor body of germanium as the result of a transverse type of effect. This effect is produced when a uniaxial stress is applied along one crystalline axis of the body and a biasing electric field along another axis. The negative resistance effect achieved is at right angles to the applied electric field.

The semiconductor oscillator described in publication (c) above is one in which high frequency oscillations are realized in a body of germanium so prepared as to have a constricted portion along its length. The electric fields are very intense at this constriction when a voltage is applied across the body. Further, the operation of the device demands that at least one of the connections to the body be an injecting contact which injects a large number of minority carriers into the germanium.

The semiconductor oscillators described in publications (d) and (e) are Gunn Effect type of devices in which high frequency oscillations are produced in a semiconductor body, usually gallium arsenide, when an electric field is applied to the body. The gallium arsenide is one conductivity type and no junction or injecting contact is required. The mechanism involved in the production of these oscillations involves the transfer of the excess majority carriers in the ballium arenide from a low energy valley to a high energy valley where they have less mobility.

Summary of the invention

The semiconductor oscillators of the present invention involve the use of a semiconductor material having majority carrier energy valleys, which are so located and responsive to applied electric fields that when a voltage is applied in a particular direction, the drift velocity of the majority carriers saturates without an appreciable transfer of these carriers to other energy valleys in which they have different mobility. After saturation is initially reached, the voltage may be increased over a relatively large range before complete avalanche breakdown occurs. Further, the dependence of the electron drift velocity on the applied electric field is such that for a finite range of fields larger than that required to produce saturation of the drift velocity, the drift velocity actually decreases with increasing applied electric field, that is, the material in this range of applied fields exhibits a bulk negative differential conductivity. Oscillations are produced in such a body when ohmic, noninjecting contacts are applied to opposing surfaces of the body and a voltage is applied across these contacts. The applied voltage is greater than the voltage necessary to saturate the carrier drift velocity, but less than that necessary to produce complete avalanche breakdown. The output is taken at a resistive or reactive load connected to the semiconductor body. The (Type I) oscillations in the body are observed to occur in a substantial portion of the semiconductor material thereby allowing appreciable power outputs to be obtained at a high frequency of regular and coherent oscillations. Further, these oscillations can be realized using germanium which is a readily available and well-known semiconductor material. In the preferred mode of practicing the invention the voltage is applied along a (100) direction in the germanium and the cross section of the germanium body perpendicular to this direction is uniform. Oscillations can be obtained over a relatively wide range of frequencies using the same semiconductor body without the necessity of using either a resonant cavity or a feedback type of circuit to control the frequency of oscillations.

Therefore it is an object of the present invention to provide a new and improved high frequency oscillator.

A further object is to provide a new and improved method of producing high frequency oscillations in a semiconductor body.

Another object of the present invention is to provide an oscillator of this type which can be simply fabricated out of readily available semiconductor material, and which is capable of producing high frequency oscillations over a relatively large range of frequencies.

The foregoing and other objects, features and advantages of the invention will be apparent from the following more particular description of preferred embodiments of the invention, as illustrated in the accompanying drawings.

Description of preferred embodiments

Figure 1:
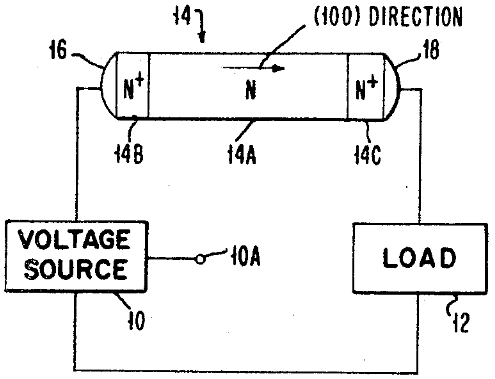
FIGS. 1 and 1A are diagrammatic illustrations of circuits employed in the practice of the invention.

The oscillator circuit shown in FIG. 1, which illustrates the preferred mode of practicing the invention, includes a voltage source 10, a load 12, and an active semiconductor device generally designated 14. Device 14 is formed of a crystal of germanium having contacts 16 and 18 affixed to opposite end surfaces of the crystalline body. The germanium crystal includes a center portion 14A which is slightly N type (about $10^{15}$ carriers per cm.$^3$) and two end portions 14B and 14C which are also N type but have a higher concentration of excess electrons than the central portion 14A (about $10^{18}$ carriers per cm.$^3$ or above). The crystal is oriented, as indicated by the arrow, so that the length of the semiconductor body between the contacts 16 and 18 is parallel to a (100) crystalline direction in the germanium semiconductor material. The device is maintained by cooling apparatus, not shown, at a temperature of 77° K.

Figure 1A:
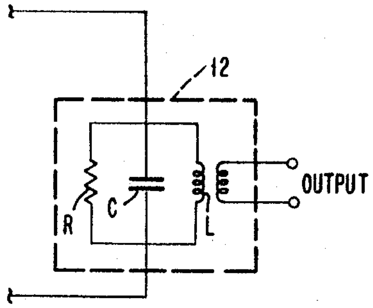

When the voltage source 10 is activated, for example, by the application of a signal at a terminal 10A, to apply a voltage across semiconductor device 14 and this voltage exceeds a certain minimum threshold voltage, high frequency oscillations are produced by device 14 which are delivered to load 12. This load may be a resistive load or, as indicated in FIG. 1A, may be reactive. Further, the load need not consist of discrete circuit elements connected directly to the body, but the load may be a cavity or waveguide which either completely or partially contains the semiconductor device 14 and is electromagnetically coupled to the device. The type of oscillations which are produced depend upon a number of parameters including the characteristics and geometry of the body of germanium, the temperature at which the circuit is operated, and the amplitude of the applied voltage.

Three different types of oscillations can be realized with the circuit of FIG. 1, and these are herein termed Type I, Type II, and Type III oscillations. Each of these types of oscillations can be taken advantage of in building circuits in accordance with the principles of the present invention. The preferred mode of practicing the invention in terms of producing very high frequency oscillations, at this stage of the development of the invention, involves the use of the Type I oscillations. These oscillations can be realized at the same temperatures as the Type II oscillations, are achieved with lower applied fields, are more regular and coherent and have a higher frequency. The Type III oscillations, which involve high field domains, appear to require a more pronounced negative conductivity effect which is most easily realized at low temperatures and the oscillations are generally at a lower frequency than the Type II oscillations. The frequency of the Type III oscillations is dependent upon the transit time of the high field domains across the semiconductor body. The Type I oscillations are typically in the range of $10^9$ cycles per second and the Type II oscillations are in the range of $10^8$ cycles per second. Though it is possible that both of these types of oscillations are produced by related physical phenomenon, the oscillations are sufficiently different to warrant their separate treatment in this application. Because of the fact that the Type I oscillations are preferred, the discussion immediately below, as well as in the main portion of this application, is directed to a description of this type of oscillation. Further, because of the fact that these oscillations are produced by what is believed to be a newly discovered phenomenon, detailed data on experiments which have been performed are provided in this application in order to provide a more complete teaching of the phenomenon itself and the various characteristics of the phenomenon which may be taken advantage of by those skilled in the art in practicing the invention.

Figure 2:
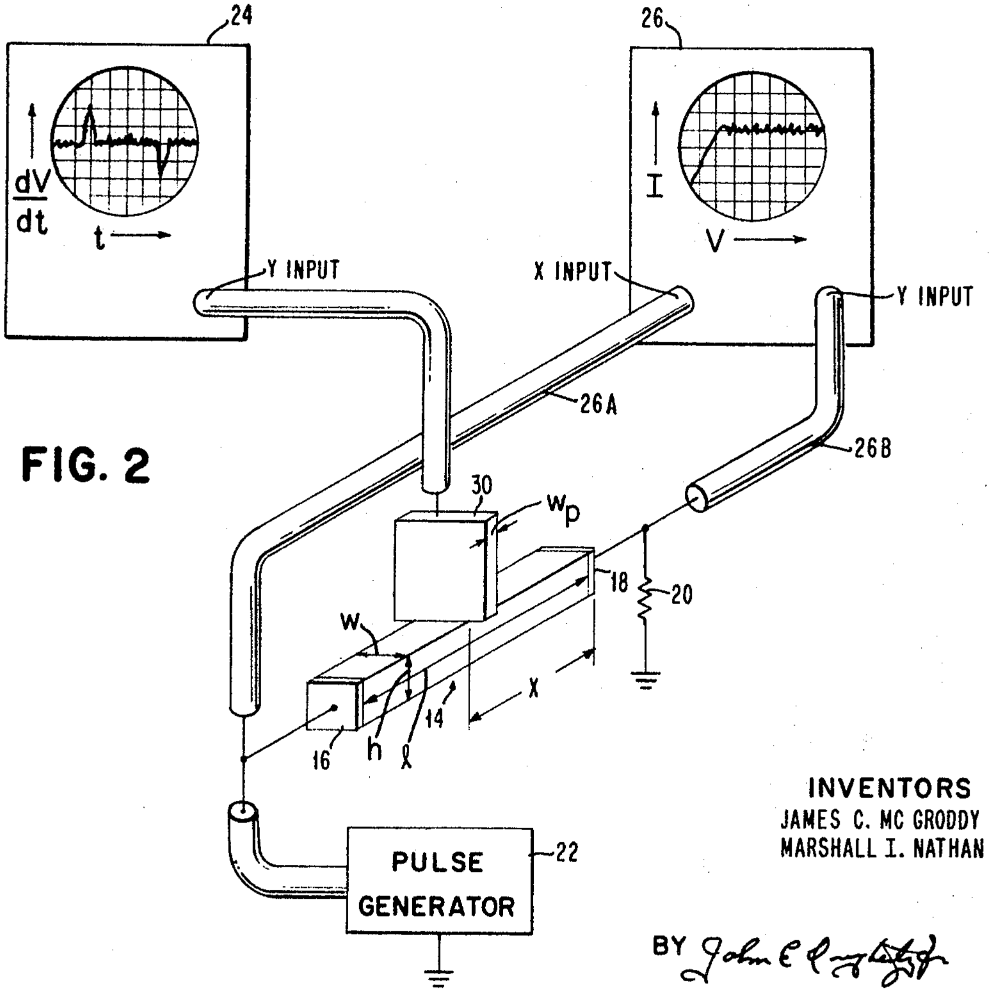
FIG. 2 is a diagrammatic representation of an experimental setup used to obtain detailed information on the phenomenon employed in producing oscillations in accordance with the present invention.

Thus, FIG. 2 shows, in somewhat schematic form, an experimental setup which was used to determine certain of the operating characteristics of an active semiconductor device such as is shown at 14 in FIG. 1, as well as certain properties associated with the phenomenon itself which are useful in understanding the phenomenon and the physical principles involved in its application. In FIG. 2 the active device 14 is shown in somewhat elongated form. The length ($l$) of the device between the end contacts 16 and 18 is, for this device, approximately 9 mils. The width ($w$) of the device, and the height ($h$) are approximately 7 mils so that the device is more cubic then the schematic showing would indicate.

The load across the semiconductor active device 14 is here a resistive load as shown at 20 and the voltage signals are applied by a voltage generator represented at 22 which is controlled to apply voltage signals of predetermined duration and amplitude to the semiconductor device 14. Though load 14 is a resistive load, there is stray inductance associated with this load, and stray reactance associated with the wires and other components of the setup. As in the circuit of FIG. 1, the length of the device across which this voltage is applied is parallel to a (100) direction in the germanium crystal.

Two oscilloscopes 24 and 26 are used in the experimental setup of FIG. 2 to obtain data useful in understanding the operating characteristics of semiconductor device 14. In the first of these experiments the I–V curve is obtained using oscilloscope 26 which, as shown in FIG. 2, has its X and Y inputs connected via cables 26A and 26B across semiconductor device 14. The voltage and current for the device 14 are related to the voltage and current for load 20, since load resistor 20 is connected in series with semiconductor device 14 and the current through this load is essentially the same as that through device 14.

Figure 3:
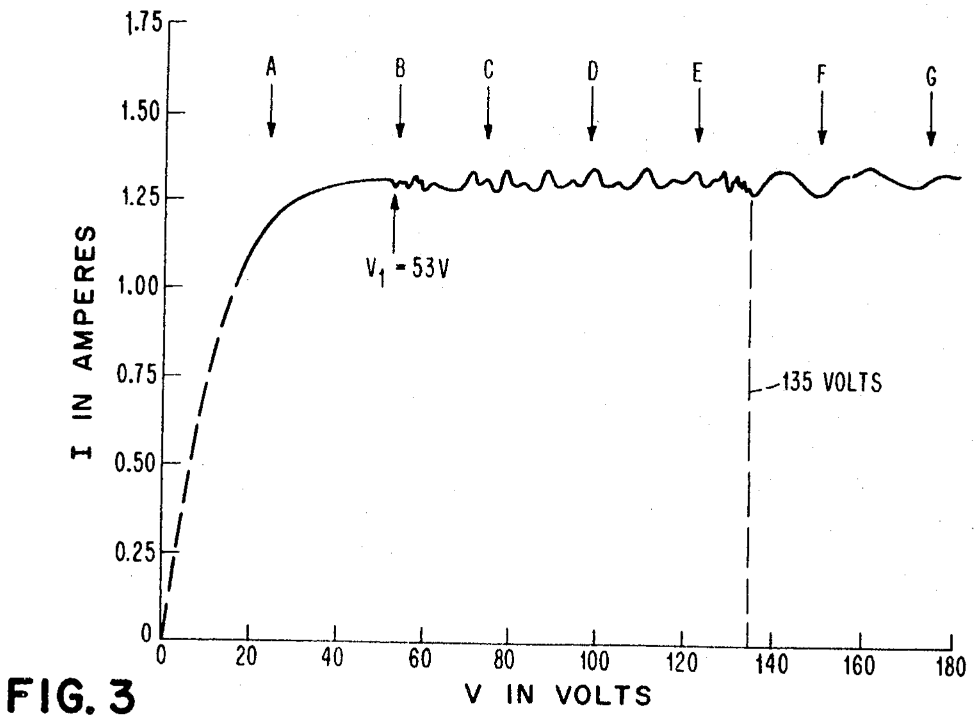
FIGS. 3, 4 and 5 are curves illustrating certain characteristics of the oscillations produced in accordance with the principles of the present invention.

The curve of FIG. 3 is obtained by applying a series of voltage pulses of increasingly higher amplitude from pulse generator 22 and measuring the current flowing through the semiconductor device at the same time during each pulse. As can be seen from the curve, the current-voltage relationship is initially linear and then the current begins to saturate until at a voltage value $V_1$ of 53 volts, a threshold is reached for the instability which produces the oscillations. The plot of FIG. 3 does not provide detailed information on the oscillations but indicates the presence of oscillations in the semiconductor device when the voltage applied is above the threshold voltage $V_1$.

Figure 4:
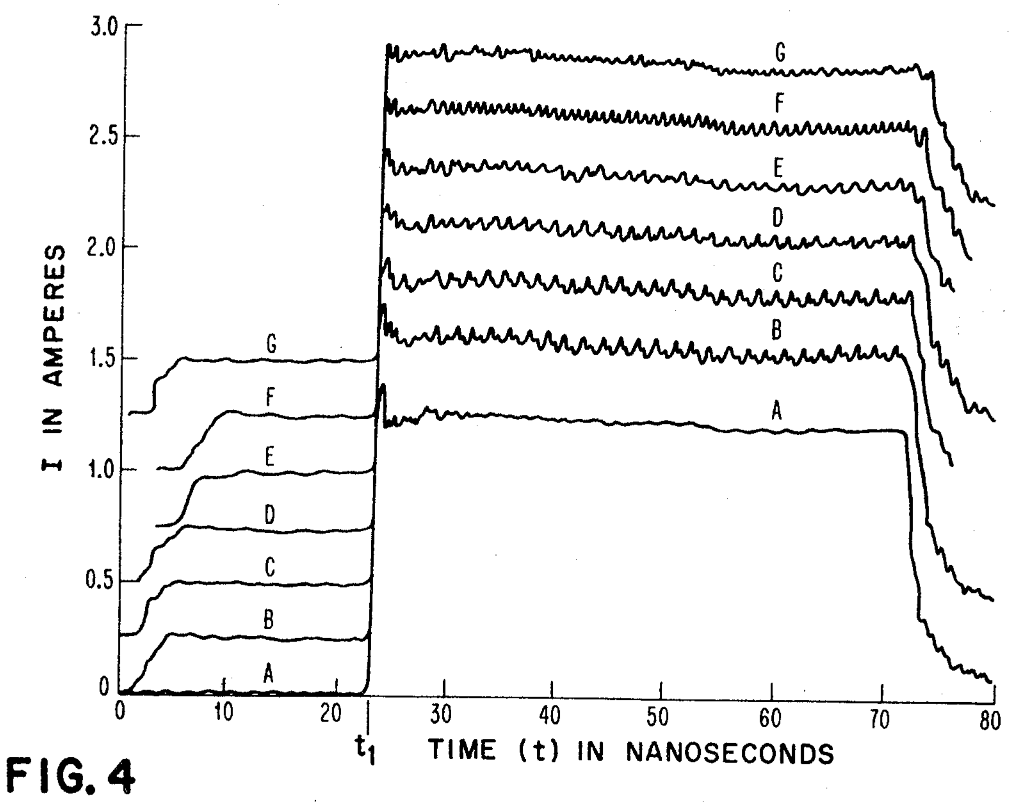

In order to obtain more detailed data on the oscillations themselves, the oscilloscope 26 is employed to obtain a plot of the manner in which the current through the semiconductor device 14 (and therefore also through load 20) oscillates with time for a given value of applied voltage. In FIG. 4 there are seven individual curves labeled A through G which correspond to the voltage values indicated by these letters in FIG. 3. The zero value of current is displaced vertically by about 0.25 amp for each successive curve to provide a clearer indication of the oscillations. For each of these curves, at a time $t_1$ a signal having the appropriate amplitude is applied across the device and the current for this voltage is obtained from plotting equipment attached to the oscilloscope. The curve of current vs. time are obtained by a sampling procedure. For each curve the generator 22 applies a series of identical voltage pulses of the proper amplitude. During each successive pulse, the current is measured for a short interval of time, which interval of time begins at a later time relative to the beginning of the pulse for each successive pulse. The time interval is much shorter than the period of the oscillations.

When the magnitude of the voltage pulse applied is less than threshold, as is indicated by curve A of FIG. 4, no current oscillations are obtained. However, when the voltage applied exceeds the threshold at 53 volts as indicated by curve B, the current oscillates at a fundamental frequency of about $(0.59)(10^9)$ cycles per second. Higher harmonics are also evident. For an applied voltage of about 74 volts (curve C), the oscillations are at $(0.65)(10^9)$ cycles per second. For an applied voltage of 98 volts (curve D) the oscillations are at a frequency of $(0.70)(10^9)$ cycles per second. For an applied voltage of 122 volts (curve E) the oscillations are at a frequency of $(0.77)$ $(10^9)$ cycles per second. From the above it can be seen that in a range of voltages immediately above the threshold voltage $V_1$ (curves B through E), the frequency of the oscillation increases somewhat linearly with the amplitude of the applied voltage. However, when the voltage is raised to the value of 150 volts (curve F), the oscillations are at a much higher frequency of about $(1.35)(10^9)$ cycles per second and when the voltage is raised to 175 volts (curve G) there is again only a slight increase in the frequency of the oscillations to about $(1.40)(10^9)$ cycles per second.

Thus, in this range of applied voltages when the threshold voltage $V_1$ is exceeded, current oscillations are produced over a large range of applied voltages. In a lower portion of this range the frequency of these oscillations changes only slightly with increases in the amplitude of the applied voltage. As the voltage amplitude is increased, a point is reached at which the frequency of oscillations increases by almost a factor of 2. Once this higher frequency upper portion of the voltage range is reached, the frequency increases only slightly with increases in the amplitude of the applied voltage.

It is therefore, evident that when operating an oscillator circuit of the type shown in FIG. 1, there is a range of applied voltages above the threshold voltage $V_1$ at which oscillations can be obtained. In the lower portion of this voltage range the frequency of the oscillations varies somewhat with the amplitude of the applied voltage but the oscillations are generally at a frequency which is about one-half that which is obtained in the higher portion of the voltage range. Though the curves of FIG. 4 are not sufficient to ascertain whether or not the change from the lower to the higher frequency occurs abruptly at a particular value of applied voltage, it is clear that an abrupt change in frequency is obtained between the applied voltage for curve E of 122 volts and applied voltage of curve F of 150 volts. An analysis of the curve of FIG. 3 indicates that this increase in frequency occurs at an applied voltage of about 135 volts. In the majority of the tests conducted to produce the Type I oscillations, the devices provided outputs in two frequency ranges as described above. However, in some devices, three ranges have been obtained between the threshold voltage $V_1$ and an upper value of voltage $V_2$. In these devices a high frequency output is obtained at and immediately above threshold voltage $V_1$. Thereafter as the voltage is increased, a lower frequency range and then a higher frequency range are produced.

Figure 5:
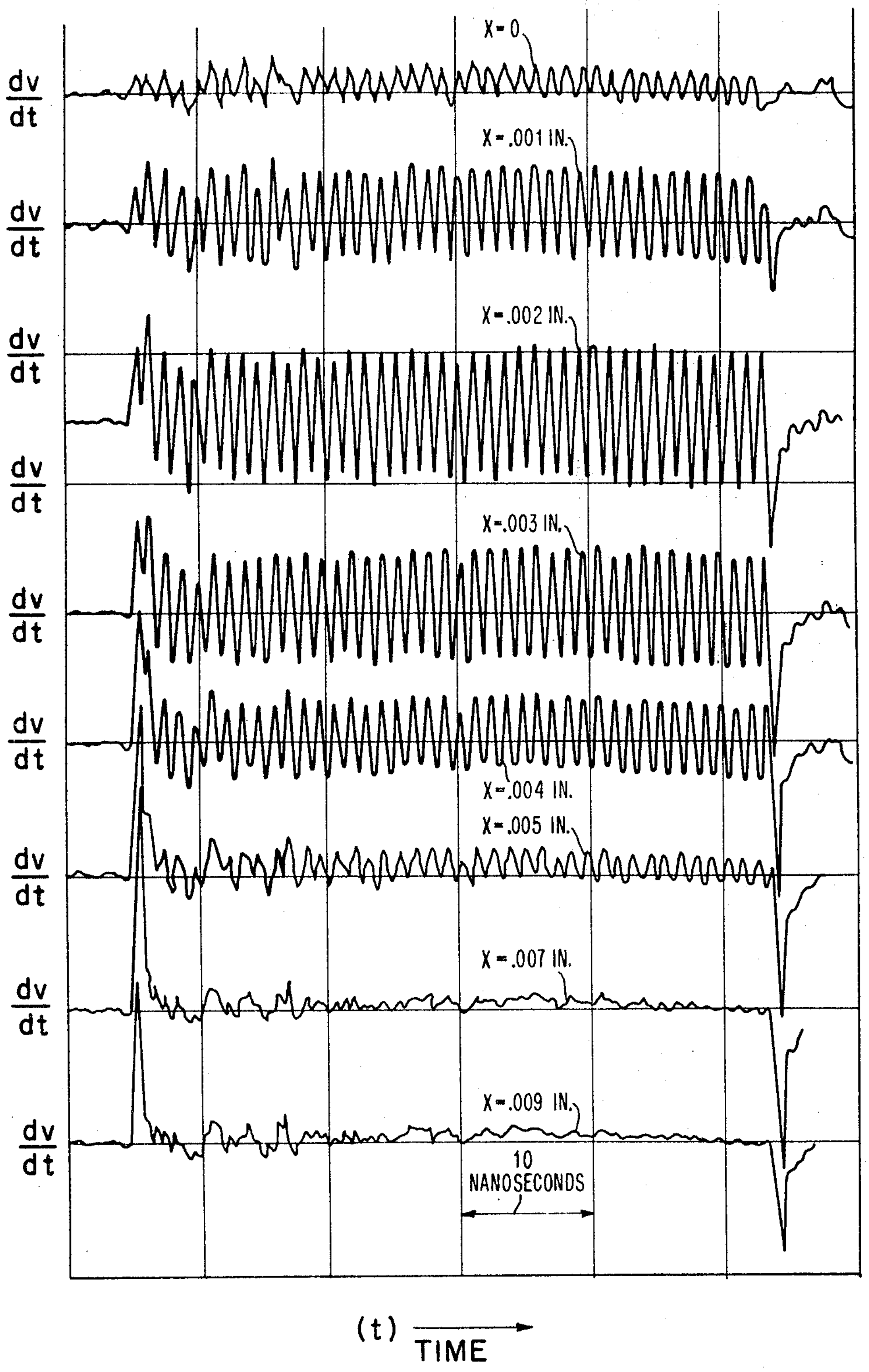

A further test which is useful in determining the nature of the phenomenon which produces the oscillations in the semiconductor device is performed with a probe which is designated 30 in FIG. 2. This probe is capacitively coupled to the device 14 and measures the change in voltage with time ($dV/dt$) in the adjacent portion of the semiconductor body. This probe is coupled to an oscilloscope 24 which is controlled to plot the value ($dV/dt$) measured by probe 30 against time, and using a conventional plotter attached to the oscilloscope 24, curves of the type shown in FIG. 5 are obtained. The probe 30 is moved by mechanical means, not shown, to different positions along the length of semiconductor device 14. In each such position, a plot is obtained of the time derivative of voltage at that position against time. The purpose of this type of test is to determine whether or not the oscillatory phenomenon is associated with some type of travelling domain, or is a bulk type of effect which produces in phase type of oscillations across all or a significant portion of the germanium crystal. The semiconductor element for this experiment was 9 mils long and had rectangular cross section of 7 mils ($l=9$ mils, $w=7$ mils, $h=7$ mils). There are eight curves in FIG. 5 which show the time voltage derivative plotted against time for eight different positions in the sample. The position along the sample is indicated by the letter X, and when the value X is small, the probe is at position adjacent to the end of the device 14 which is connected ot the positive terminal (anode) or pulse generator 22. Each of the curves in FIG. 5, therefore, provides an indication of the manner in which the voltage is changing at a particular position along the semiconductor device 14. It can be seen from an examination of these figures that the amplitude of change in voltage increases with the distance from the anode to a maximum which is achieved at about 2 mils from the anode. Thereafter, the amplitude decreases as the probe is moved away from the anode towards the cathode. The phase of the voltage changes measured is not strongly dependent on position along the sample as would be the case if high field domains were propagating through the sample.

A further test was performed with the same device wherein the polarity of the applied voltage was changed so that the one of the connections 16 and 18 which was the cathode became the anode and the other contact which had been the anode became the cathode. The same type of results were achieved in that the amplitude of the voltage was measured to be higher in the portion of the germanium crystal which was nearer the anode. In tests performed on other devices, this type of behavior was not as pronounced in that significantly higher voltage oscillations were not necessarily found in that portion of the semiconductor crystal which was nearer the anode. However, these tests of devices providing Type I oscillations gave no evidence of any type of travelling phenomenon such as a travelling domain of high field intensity which are realized in Gunn Effect type devices. Rather the tests indicate that a bulk type of effect which occurs across a substantial portion of the specimen is involved.

In order to provide further data on the nature of the phenomenon involved in these oscillations, a strain test was performed in which a uniaxial stress was applied to a device along the (100) direction when the current was flowing in that direction. For stresses applied up to $(1.3)(10^4)$ kilograms per $cm.^2$ the effect on the threshold voltage $V_1$ was less than 2%. This test indicates that the effect does not produce transfer of energy carriers (electrons) from the low energy valleys in which they are normally located in germanium to higher energy valleys, that is an effect similar to the transfer between valleys associated with the Gunn Effect. If such a transfer between valleys in germanium were involved, the application of the stress in the (100) direction would be expected to produce an appreciable reduction in threshold voltage, which is not the case.

Further stress tests were performed by applying uniaxial compression along the (110) direction of the crystal as well as along the $(\overline{1}\overline{1}0)$ direction. These experiments were performed with a germanium device in which the current was flowing along the (110) direction. Compression along the (110) direction raised the threshold voltage significantly while compression along the $(\overline{1}\overline{1}0)$ reduce the threshold. This being the case, it does not appear that a transverse instability of the type produced by Erlbach (Patent No. 3,215,962, cited above) is involved.

Another capacitive probe test was performed, which differed from the tests described above, in that two long probes were placed adjacent to the top and bottom surfaces of the semiconductor body 14, as viewed in FIG. 2. These probes extended over the entire length of the body. The outputs from these two probes, as displayed on the oscilloscope, showed that the oscillations at the opposite surfaces are in phase. The test demonstrates that the oscillations are longitudinal and do not arise from a transverse effect of the type taught by Erlbach.

A further series of strain tests have been performed at 77° K using hydrostatic apparatus to apply a uniform rather than uniaxial stress to the entire device. During this test it was observed that as the stress was increased, the threshold voltage necessary to produce oscillations increased slightly. Secondly, the range of voltages between the threshold voltage $V_1$ and the upper value of applied voltages, here termed $V_2$, at which the Type I oscillations disappear or become incoherent, decreases rather sharply as the applied stress increases. The voltage range (between $V_1$ and $V_2$) over which the oscillations are realized is decreased as the uniform stress is increased, until a point is reached when the oscillations disappear completely. In the tests thus far conducted the uniform pressure necessary to cause cessation of the oscillations was typically about 4000 atmospheres though in certain devices applied pressures of 2800 atmospheres was sufficient.

A large number of germanium crystals have been used in fabricating oscillators in accordance with the principles of the present invention. The test data on a number of these devices are provided at the end of this specification. From this data it can be concluded that the oscillations are produced by an effect which occurs when the drift velocity of the electrons in the N-type germanium becomes saturated and the applied voltage (electric field) is increased in the saturation range. In order to provide a background for description of drift velocity and the relationship of this parameter to the operation of the device in terms of the germanium crystal structure, reference is made to FIGS. 6, 7, 8 and 9.

Figure 6:
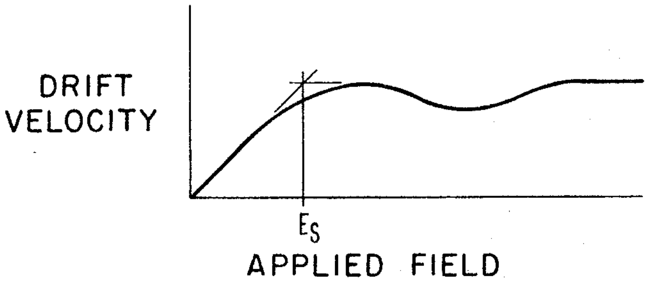
FIG. 6 is a plot of the drift velocity of the electrons in a body of germanium in the presence of an applied electric field.

FIG. 6 is a plot of the drift velocity of the majority carriers in a body of semiconductor material such as germanium in the presence of an applied field. The drift velocity, which is plotted as the ordinate in this figure, the average velocity of the majority carries (electrons for N-type material) in the direction of the applied field. As is evident from the curve, as the applied field is increased, the drift velocity initially increases until a value of applied field $E_S$ is reached at which saturation occurs. Though it is very difficult to experimentally determine the exact shape of the portion of this curve in the saturation region above $E_S$, there is no doubt that saturation does take place and it has been generally believed that the curve was flat above $E_S$. In reality it has been discovered that, as indicated in FIG. 6, that there is a negative portion in the saturation region of the curve. The negative portion of this curve is associated with the bulk negative differential conductivity which has been found to be present in germanium in the presence of high electric fields. Measurements of this negative conductivity effect at different temperatures have shown that the magnitude of the effect increases as the temperature of the germanium is lowered. Thus, the differential negative conductivity is much greater at 27° K. than at 77° K. It is believed that this is the reason that the Type I oscillations can be produced in the same devices at higher temperatures than the Type III oscillations which are discussed in detail below. Further, it has also been observed that where the negative conductivity effect is weak, the Type I oscillations are more dependent upon the impedance characteristics of the circuit in which the device is connected. Thus, some devices have been found not to oscillate at 77° K. satisfactorily in circuits which include very little stray inductance, but do oscillate when the circuit in which they are connected includes more inductance.

One phenomenon which has been known to occur when the applied field is greatly in excess of $E_S$ is that which is employed in the British Patent to Gunn cited above. Specifically, when the applied voltage is increased sufficiently, especially in samples which are nonuniform, a point is reached at which avalanche breakdown occurs. This avalanching produces minority carriers and causes the device to exhibit a negative resistance. In the application of the present invention the applied voltages, and therefore, the applied fields are maintained at a value less than that necessary to produce avalanching and the effect which is employed to realize the Type I and Type III oscillations is one which involves majority carriers rather than minority carriers. More specifically, in the preferred embodiments lightly doped N-type germanium is used and tests have been carried out in which the voltage is applied by contacts which are carefully prepared so as to be noninjecting and, therefore, incapable of providing any minority carriers to the main semiconductor body.

The plot of FIG. 6 is typical of a material such as germanium wherein the drift velocity saturates and larger applied fields do not produce any transfer of electrons from the energy valleys in which they ordinarily are located to higher energy valleys in which they have lower mobility. It is this type of intervalley transfer which is taken advantage of in gallium arsenide and other similar materials in producing Gunn Effect type oscillations.

Figure 7:
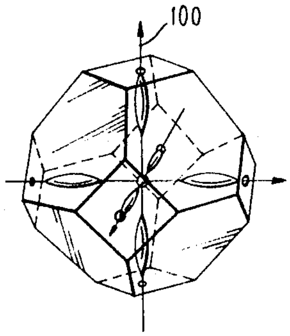
FIGS. 7, 8 and 9 are illustrations of the conduction energy valleys relative to the crystalline structure of a body of crystalline germanium.
Figure 8:
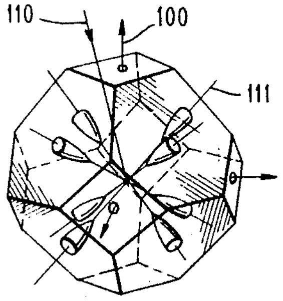

FIGS. 7 and 8 are somewhat diagrammatic representations of the energy valleys in germanium. FIG. 7 shows the seven higher energy valleys which are present in the material but which are not normally occupied by electrons. In FIG. 8 the eight lower energy valleys for electrons are illustrated and it is in these valleys that the electrons in germanium are normally located. The two figures are used to demonstrate the valleys since it is believed that an attempt to show all the valleys in a single figure would overcomplicate the drawings.

Figure 9:
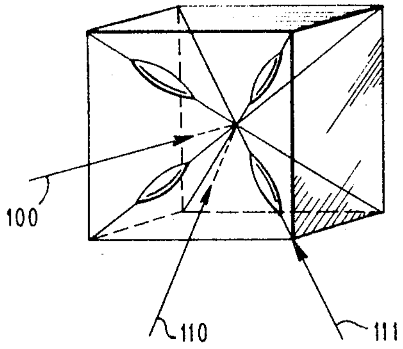

In both FIGS. 7 and 8 the (100), the (110) and the (111) crystalline directions are indicated. It is clear in FIG. 8 that the eight low energy valleys, each of which is shown as half an ellipsoid, are located along the (111) direction of the crystalline material. FIG. 9 is an illustration of the energy valleys of FIG. 8 wherein the eight valleys are shown as four complete ellipsoids along the (111) directions with each of the ellipsoids of FIG. 9 representing a combination of two of the half ellipsoids in FIG. 8. This is a conventional way of illustrating these energy levels and is helpful here in simplifying the description of the phenomenon underlying the invention, and at the same time, providing the proper teaching of the best mode of taking advantage of this phenomenon in building oscillators in accordance with the principles of the invention.

As has been pointed out above, in the preferred mode of carrying out the invention, the voltage and, therefore, the field is applied along a (100) direction of the crystalline germanium. As can be seen in FIG. 9, and also in FIG. 8, an electric field applied in this direction is symmetrical with respect to all of the low energy valleys in which the excess charge carriers in the germanium are located. For this reason the effect on the electrons in each of the four energy valleys of FIG. 9 (or eight energy valleys in FIG. 8) is the same; the electrons in each valley respond to the field in essentially the same way. That is, initially the drift velocity of the electrons increases with applied fields until a point is reached at which saturation occurs in essentially all the energy valleys at one time. It is this condition which has been found most conducive to the production of the current instability in germanium and the oscillations which are taken advantage of in the practice of the present invention. As the applied field is further increased, a threshold value is reached at which the oscillations are produced. It should be noted that in this type of operation there is no significant transfer of the charge carriers from the lower energy valley shown in FIGS. 8 and 9 to the higher energy valleys shown in FIG. 7. That this is the case has been verified by the strain tests which have been described above. The tests also illustrate clearly that the effect is a majority carrier effect. Further, for the Type I and Type III oscillations at least, the applied voltage and, therefore, the applied field is less than that necessary to produce any avalanching in the semiconductor material.

Devices constructed of germanium of the type shown in FIG. 1 have also been operated when the ohmic connections are so oriented to the crystalline axis that the applied voltage is in a (110) direction in the crystalline material. As is evident from FIG. 9, in such a case, the applied field is not exactly symmetrical with respect to the energy valleys. However, such devices have been found to exhibit the same current instabilities and resulting oscillations, though the effect is much less pronounced when the crystal is oriented so that the field is along the (110) direction, than when, as described above, the field is applied in the (100) direction. When, however, the voltage and, therefore, the electric field is applied along one of the (111) directions in the germanium crystal, the current instability is not observed and oscillations are not produced in the bulk of the material. As is shown in FIG. 9, when the field is applied in this direction, it is completely unsymmetrical with respect to one of the energy ellipsoids which is located along the particular (111) direction that the field is applied. Therefore, the drift velocity does not saturate with any degree of uniformity in the four valleys and the conditions necessary to produce the current instability in the germanium and the oscillations are not realized.

In summary, it can be seen from the discussion above that the preferred practice of the invention calls for application of the voltage to a semiconductor material in which the drift velocity saturates in a relatively uniform manner in all of the lower energy valleys in the material; further, the material must be such that its drift velocity-electric field characteristic includes a negative region. Further the saturation must be accomplished without any significant transfer of excess charge carriers from these valleys to higher energy valleys as in the case in a material such as gallium arsenide. Though it is preferable that the field be applied in the most symmetrical fashion, for example in the (100) direction in germanium, oscillations can also be produced when the field is applied in such a manner as to be not completely nonsymmetrical. Thus, in germanium the (110) direction can be used to produce the oscillations but on effect is achieved along the (111) direction.

From the large number of devices which have been fabricated and tested to demonstrate the various attributes of the present invention, other preferred parameters of geometry and mode of operation have been determined. Thus, devices having different geometries with respect to the cross section of the devices perpendicular to the applied field have been fabricated. Best results are achieved where the cross section of the device is essentially uniform perpendicular to the direction in which the field is applied. Further, the Type I oscillations, which have been discussed up to this point, and are the preferred mode of practicing the invention, are best achieved in shorter samples, that is having a length between the ohmic connections up to about 1 millimeter. When the length between the contacts is longer than this, the conditions appear to be more conducive to produce the Type II oscillations, which will be discussed below. In the embodiment of the invention which is shown in FIG. 1 an N+ region is employed at either end of the semiconductor body in combination with the contact to form an ohmic noninjecting connection to the main body of germanium material. Though this type of structure has been found to be preferable, it is not critical. A number of different methods have been employed in making ohmic contacts to the semiconductor body. The N+ regions have been made using both diffusion and solution regrowth techniques. The contacts have been applied by both soldering and alloying. Devices have been built and successfully tested both with and without the diffused or solution grown N+ regions. In the latter type devices the contacts are made directly to the lightly doped body of germanium.

The carrier concentration in the germanium and, more specifically, the number of excess majority carriers in the material, is important to the operation of the device. As is the usual case, this and other parameters are related to the mode in which the device is operated. In the temperature range between 27° K. and 120° K., germanium with excess carrier concentrations in the range of $4\times10^{14}$ carriers per cm.$^3$ to $3.3\times10^{15}$ carriers per cm.$^3$ have been successfully operated. In this temperature range, germanium devices in which the carrier concentration is in the order of $2.7\times10^{14}$ carriers per cm.$^3$ have not shown evidence of the current instability and the oscillatory phenomenon.

The Type I oscillations, as discussed above, have been found to occur in a voltage range (between $V_1$ and $V_2$) having two distinct portions in each of which the frequency varies slightly with increasing voltage. The frequencies are much higher (about twice as great), in the upper portion of the voltage range though, as mentioned above, certain devices exhibit high frequency outputs over a narrow range of voltages immediately above the threshold voltage. Though all of the frequencies realized with any one device have not exhibited any direct relation to the length of the device, the average minimum frequency achieved for each device appears to be related to the length. Thus, the average minimum product of frequency and length has been found to be about $2.5\times10^7$ cm. per second.

The fact that the Type I oscillations under consideration do not involve, to any significant degree, any minority carrier effect is substantiated by the curves of FIGS. 3 and 4, which show that the average current through the semiconductor device remains essentially the same when the oscillations are being produced. Such would not be the case if an avalanching type of mechanism were involved or any other mechanism which provides significant amount of minority carriers (e.g., injecting contacts), since in such a case the resistivity of such a device would decrease and the average current would increase.

The principal embodiments of the invention thus far described, and the characteristic curves which indicate in more detail the manner in which the oscillations are produced, have employed loads which are primarily resistive but do include some inductance. In the tests preferred on the devices, the load designated 12 in FIG. 1 and 20 in the experimental setup of FIG. 2, has been varied between 1 and 20 ohms without producing new significant changes in the output oscillations. However, the operation of the invention is not limited to resistive loads nor must the device be operated in such a way that the characteristics of the load does not combine with those of the semiconductor device to produce a desired mode of operation. Thus, as is indicated in FIG. 1A, the load may be a reactive load including inductance and capacitance, which may be chosen to provide resonance at a particular frequency of oscilltion (above $10^8$ cycles per second) in the circuit which includes the semiconductor device 14.

Figure 10:
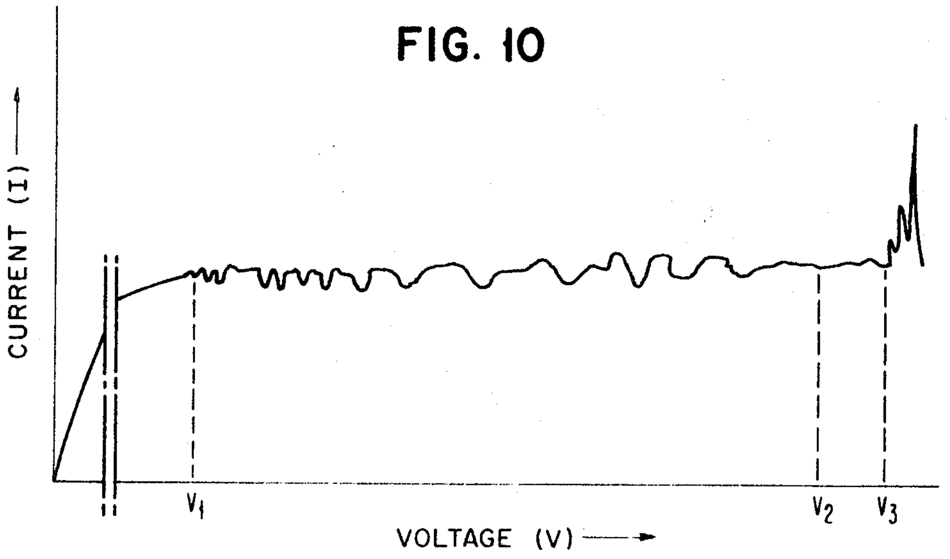
FIG. 10 is an I–V characteristic illustrating Type I and Type II oscillations which can be realized in oscillators built in accordance with the principles of the present invention.

The description up to now has been concerned exclusively with the preferred or Type I oscillations. The characteristics of the second or Type II oscillations are illustrated in FIG. 10 which is an I–V characteristic obtained using an experimental type setup such as that shown in FIG. 2. The initial portion of this curve is similar to that shown in FIG. 3 in that the presence of oscillations is indicated at a threshold voltage $V_1$ and over a range of applied voltages to a voltage here designated $V_2$. This is the range for the Type I oscillations and these oscillations are at the same average current. In the upper portion of this range between voltages $V_1$ and $V_2$ the oscillations are found to be at a higher frequency (about twice as great) as in the lower portion of the range. However, when the voltage is increased above the value $V_2$ to a voltage value $V_3$, the second type of oscillations (Type II) are produced. As shown, these oscillations occur at a higher average current indicating that these oscillations are accompanied by a phenomenon involving minority carriers. More specifically, measurements of these oscillations shown that they are at a frequency of about $10^8$ cycles per second, that is lower by a factor of 10 than the oscillations in the voltage range $V_1$ and $V_2$. Further, in devices thus far tested these high field oscillations are less regular and less coherent than those produced in the lower voltage range. It is believed that these high field oscillations are produced by a periodic generation of excess electron hole pairs by high energy electrons in localized regions of semiconductor germanium. More specifically, it is believed that an effect similar to avalanching occurs but the effect is a periodic one which is not accompanied by a stable breakdown which continuously injects minority carriers throughout the semiconductor body. Therefore, the negative resistance type of characteristic which is discussed in the British patent cited above is not obtained. It should be noted that the preferred conditions for the realization of the negative resistance of this patent are not present here, that is the geometry is not such as to provide high field regions. In any event these high field oscillations do not involve complete avalanche breakdown throughout the semiconductor body. These oscillations are indicated in FIG. 3 to begin at a voltage value $V_3$. In many of the devices tested which exhibit both types of oscillations, the transition from one type of oscillation to the other was found to be abrupt, that is $V_2$, as defined, would be equal to $V_3$. However, these two values are so identified here to provide a basis for defining the two different voltage regions which produce the two different types of oscillations.

The Type III oscillations which have been realized in germanium devices, as described above, differ from the Type I and Type II oscillations in that, with presently available material, the devices require a lower temperature environment for satisfactory operation; and the frequency of the oscillations is not strongly dependent upon applied voltage once the threshold voltage is exceeded, but rather is dependent upon the length of the germanium body between the ohmic contacts. Tests have been conducted at liquid neon temperatures (27° K.) on devices which produce oscillatory outputs. The current wave form of these oscillations has a spiked shape which is typical of oscillations produced by high field domains that are nucleated, propagated and extinguished in the body. Further, the frequency of these oscillations, unlike the Type I and Type II oscillations, does not change sharply as the applied voltage is changed once the threshold has been exceeded, but is determined by the length of the semiconductor body. Subsequent capacitive probe experiments performed at 27° K. have verified that the Type III oscillations are produced by high field domains propagating in the germanium body. Though these oscillations are similar in appearance to those produced in gallium arsenide Gunn Effect devices, the observed negative conductivity which is the basis for the production of these domains is not believed to be associated with an intervalley transfer of majority carriers but rather, by a different, though not yet completely understood, new phenomenon.

As has been mentioned above, semiconductor devices of the type described have been found to be better suited to produce the more desirable Type I oscillations when the length of the device is 1 millimeter or less in length. When the device is made longer, Type II oscillations are more likely to occur. Testing of the device has also shown that better results in terms of large amplitude signals and coherent oscillations are produced in devices in which the geometry of the device is essentially uniform, and more specifically, where the cross sectional area of the device is the same throughout its length. One explanation for these test results follows from the fact that the Type II oscillations require a high field in a single localized portion of the semiconductor body. Such a field can be generated at an imperfection, or discontinuity in either geometry or doping and imperfections of this type are more likely in larger devices. Secondly, where the device is long, the voltage which must be applied to produce the field necessary to provide the Type I oscillations throughout a significant portion of the bulk of the material is much higher, and in any such device the presence of any imperfection will more likely produce the localized condition necessary for the Type II oscillations.

Figure 11:
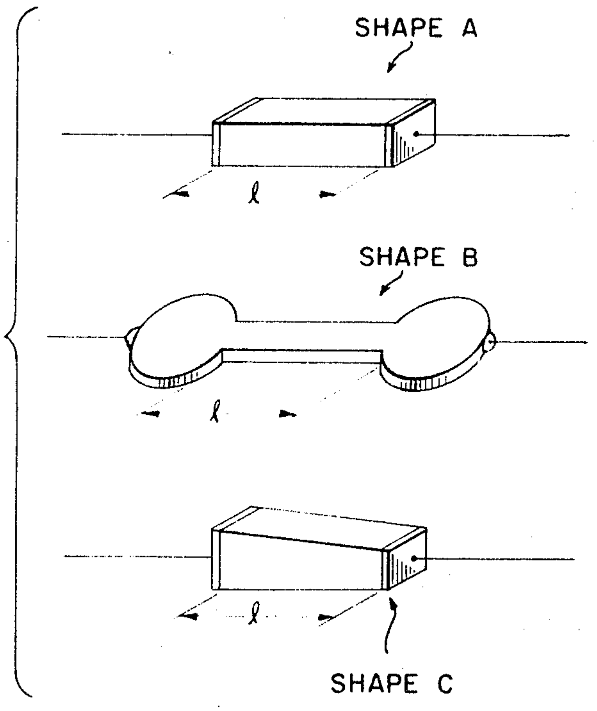
FIG. 11 is an illustration of three different shapes of bodies of germanium which have been employed in tests used to determine the characteristics of oscillators constructed in accordance with the principles of the present invention.

The table which is given at the end of this specification provides detailed data on the manner of preparing a number of devices constructed in accordance with the principles of the present invention and the operating characteristics of these devices. Three different types of geometry were employed as indicated somewhat schematically in FIG. 11. The regular preferred geometry is that indicated at A in this figure in which the cross section of the device between the electrodes is essentially uniform. In the table below, this shape is designated as A. In the second geometry, as shown, a symmetrical cross section area of the device is provided over the middle of the device. However, the ends of the device are much larger. With this shape, the Type II oscillations are generally obtained. This geometry is referred to in the table as the B shape. The final shape, which is the C shape in the table below, is one which is very similar to that of A but in which one surface of the device has been lapped so that its cross sectional area is nonuniform throughout the device. These devices have been found to produce Type I oscillations. This geometry has been found to be such as not to produce as large oscillations as the uniform device having the shape indicated in A. However, the threshold $V_1$ is lower than for an equivalent device having uniform cross section. Further, with this geometry, the devices have been found in most cases to be polarity sensitive. More specifically, the oscillations only occur when a particular one of the electrodes is connected to the positive terminal and the other to the negative terminal of the voltage source. This is not the case for the preferred geometry shown in A.

In the table below, data is provided for a number of devices which have been tested to provide oscillations in accordance with the principles of the present invention. The table provides the device number and an asterisk indicates when the same device has been operated with the polarity of the applied voltage reversed. The length ($l$) of each device is the length of the semiconductor body prior to the alloying or diffusion steps used in forming the N+ regions and the ohmic connections. Thus, for example, referring to FIG. 1 the length of the device would include the two N+ regions 14B and 14C. The crystal number in the table identifies the crystal from which the semiconductor body is obtained, and data giving the room temperature resistivity and the concentration of the excess charge carriers for each of these crystals is provided at the end of the table. All of these crystals were germanium crystals doped with antimony. However, oscillations have been obtained in germanium using other dopants such as bismuth. The value $V_1$ in the table refers to the threshold voltage for the onset of the Type I oscillations and the value $E_1$ represents the electric field computed by dividing this voltage by the length ($l$). The voltage value $V_3$ is the threshold voltage for the onset of the Type II oscillations, and the value $E_3$ is the electric field as computed by dividing the threshold voltage $V_3$ by the length $l$. Data is also provided on the shape of each device, the manner in which the ohmic connections were made to the device, and the direction in which the voltage was applied relative to the crystallographic structure of the device. The frequencies observed for all of the Type I oscillations were in a range from 0.2 to $2.7\times10^9$ cycles per second. The majority of devices provided output frequencies in the Type I mode of between 0.7 and $2\times10^9$ cycles per second. The Type II oscillations observed at the higher voltages were about $1\times10^8$ cycles per second.

| Crystal No. | Room temperature resistivity (ohm cm.) | Carrier concentration |
|---|---|---|
| N813 LD | 1.77 | $9.5\times10^{14}$ cm.$^{-3}$ |
| N756 LD | 3.00 | $5.5\times10^{14}$ cm.$^{-3}$ |
| PC 723 | 1.97 | $8.5\times10^{14}$ cm.$^{-3}$ |
| PC 741 | 2.08 | $7.6\times10^{14}$ cm.$^{-3}$ |
| PC 707 | ~4.00 | $\sim4.0\times10^{14}$ cm.$^{-3}$ |

While the invention has been particularly shown and described with reference to preferred embodiments theeof, it will be understood by those skilled in the art that various changes in form and details may be made therein without departing from the spirit and scope of the invention.

What is claimed is:

1. An oscillator circuit comprising:

(a) a body of semiconductor material having an excess of charge carriers of one conductivity type;

(b) said semiconductor body normally having one or more low energy valleys in which said excess charge carriers are located and being in a state in which said carriers are in said one or more energy valleys in a normal energy relationship;

(c) said semiconductor body including means responsive when a voltage above a saturation voltage is applied across said body in at least one particular direction which is symmetrical relative to said one or more energy valleys to exhibit saturation in the drift velocity of the excess charge carriers;

(d) said semiconductor material exhibiting the further property that when said applied voltage is raised above said saturation voltage said saturation condition is maintained without appreciable transfer of said charge carriers from said one or more low energy valleys to high energy valleys in which the carriers have a different mobility in said material, and at a threshold voltage ($V_1$) above said saturation voltage a high frequency current instability and high frequency oscillations are produced in the bulk of said semiconductor material;

(e) noninjecting ohmic connections connected to said body and voltage means connected to these connections for applying a voltage above said threshold voltage to said body in said particular direction to produce high frequency current oscillations in said body;

(f) said applied voltage being less than the voltage

| Device | Length (l) | Crystal No. | Orient | Volts, $V_1$ | $E_1=V_1/l$, volt/cm. | Volts, $V_3$ | $E_3=V_3/l$, volt/cm. | Shape | Contacts |
|---|---|---|---|---|---|---|---|---|---|
| 2 | 2.76 | N813LD | 100 | | | 920 | 3,360 | B | Solder. |
| 14 | 2.5 | N813LD | 110 | 600 | 2,400 | | | A | Au(Sb)alloy. |
| 98 | 1.9 | N756LD | 100 | 270 | 1,425 | 470 | 2,480 | A | Do. |
| 98 [1] | 1.9 | N756LD | 100 | 265 | 1,400 | 350 | 1,840 | A | Do. |
| 117 | 0.38 | PC723 | 100 | 100 | 2,630 | 280 | 7,400 | A | Regrown Sn(As). |
| 117 [1] | 0.38 | PC723 | 100 | 110 | 2,900 | 430 | 11,300 | A | Do. |
| 118 | 0.38 | PC723 | 100 | 84 | 2,200 | | | A | Do. |
| 118 [1] | 0.38 | PC723 | 100 | 89 | 2,340 | | | A | Do. |
| 119 | 0.38 | PC723 | 100 | 80 | 2,100 | | | A | Do. |
| 119 [1] | 0.38 | PC723 | 100 | 60 | 1,580 | | | A | Do. |
| 120 | 0.38 | PC723 | 100 | 70 | 1,840 | | | A | Do. |
| 120 [1] | 0.38 | PC723 | 100 | 69 | 1,813 | | | A | Do. |
| 123 | 0.38 | PC723 | 100 | 60 | 1,567 | | | A | Do. |
| 123 [1] | 0.38 | PC723 | 100 | 60 | 1,567 | 415 | 10,900 | A | Do. |
| 131 | 1.25 | PC723 | 100 | | | 212 | 1,700 | A | Au(Sb) alloy. |
| 131 [1] | 1.25 | PC723 | 100 | | | 220 | 1,760 | A | Do. |
| 132 | 1.25 | PC723 | 110 | | | 500 | 4,000 | | Do. |
| 132 [1] | 1.25 | PC723 | 110 | | | 900 | 7,200 | | Do. |
| 143 | 0.28 | PC723 | 100 | 59 | 2,100 | | | A | Diffuse As. |
| 143 [1] | 0.28 | PC723 | 100 | 60 | 2,140 | >250 | >9,000 | A | Do. |
| 144 | 0.28 | PC723 | 100 | 53 | 1,890 | | | A | Do. |
| 144 [1] | 0.28 | PC723 | 100 | 53 | 1,890 | | | A | Do. |
| 145 | 0.28 | PC723 | 100 | 60 | 2,140 | | | A | Do. |
| 145 [1] | 0.28 | PC723 | 100 | 60 | 2,140 | | | | |
| 155 | 1.25 | PC707 | 100 | 350 | 2,800 | | | A | Au(Sb) alloy. |
| 313 | 0.33 | PC723 | 100 | 58 | 1,740 | 370 | 11,200 | | Diffuse As. |
| 416 | 0.7 | PC723 | 100 | 124 | 1,770 | 325 | 4,650 | | Do. |
| 432 | 0.22 | PC741 | 100 | 56 | 2,545 | | | | Do. |
| 432 [1] | 0.22 | PC741 | 100 | 63 | 2,860 | | | | |
| 443 | 0.22 | PC741 | 100 | 46 | 2,090 | | | C | Do. |
| 443 [1] | 0.22 | PC741 | 100 | | | | | C | |
| 444 | 0.22 | PC741 | 100 | 42 | 1,910 | | | C | Do. |
| 444 [1] | 0.22 | PC741 | 100 | | | | | C | |
| 445 | 0.22 | PC741 | 100 | 34 | 1,545 | | | C | Do. |
| 445 [1] | 0.22 | PC741 | 100 | | | | | C | |
| 468 | 0.22 | PC741 | 100 | 56 | 2,540 | | | A | Do. |
| 468 [1] | | | | 53 | 2,410 | | | | |
| 540 | 0.22 | PC741 | 100 | 57 | 2,590 | | | A | Do. |
| 540 [1] | | | | 53 | 2,410 | | | | |

necessary to produce avalanche breakdown in said body;

(g) and load means coupled to said body for responding to said high frequency oscillations in said body to provide a high frequency output from said oscillator circuit.

2. An oscillator comprising:

(a) a body of crystalline germanium having first and second surfaces essentially perpendicular to a (100) crystalline direction in said body;

(b) said body including a central portion doped lightly with an N-type impurity and first and second end portions adjacent to said surfaces doped more heavily with an N-type impurity;

(c) a pair of contacts connected to said first and second surfaces;

(d) a voltage source connected across said contacts for applying voltage across said body in said (100) direction;

(e) the cross section of said central portion of said body being essentially uniform;

(f) said contacts together with said end portions forming noninjecting ohmic connections to said body so that minority carriers are not injected into said germanium body when said voltage is applied across said contacts;

(g) said germanium body exhibiting a drift velocity of current carriers in the (100) direction which is essentially linear at low voltages applied in the (100) direction between said contacts, but which saturates at higher values of applied voltages;

(h) said body including within itself means responsive to a range of voltages between a lower voltage value $V_1$ and a higher voltage value $V_2$ applied between said contacts in said (100) direction to produce in the bulk of the body coherent in phase high frequency oscillations;

(i) the frequency of said coherent oscillations in a portion of said range for higher applied voltage being greater than the frequency of said coherent oscillations in the lower portion of said range of applied voltage;

(j) the lower one of said voltage values $V_1$ being greater than that necessary to saturate the current carrier drift velocity in said body;

(k) the upper one of said voltage values $V_2$ being less than that necessary to produce avalanche injection of carriers in said body;

(l) means for causing said voltage source to apply between said contacts a voltage between said values $V_1$ and $V_2$ to produce bulk microwave oscillations in said body;

(m) and load means coupled to said body for producing a high frequency output.

3. An oscillator comprising:

(a) a body of crystalline semiconductor material having a number of excess charge carriers of one conductivity type;

(b) said body including a plurality of energy valleys and the excess charge carriers of said one conductivity type in said body being normally in a number of low energy valleys having the lowest energy level for carriers of that conductivity type at a particular temperature in the absence of an electric field;

(c) said semiconductor body having the property that when a voltage is applied to said body in a particular direction which is symmetrical relative to said number of low energy valleys the drift velocity of said excess charge carriers in that direction saturates without significant transfer of the carriers between said low energy and higher energy valleys in which the carriers have different mobilities;

(d) said semiconductor body including within itself means responsive to produce a high frequency current instability and high frequency current oscillations in the bulk of the body along said particular direction when voltages are applied to the body in said particular direction in a range of voltages between a low value $V_1$ and a high value $V_2$ both of which are greater than the voltage at which the drift velocity of excess charge carriers saturates in said body;

(e) and means including noninjecting contact means connected to said body for applying to said body in said particular direction a voltage in the range between said values $V_1$ and $V_2$ to produce coherent oscillations in said body;

(f) and, output load means coupled to said body.

4. The oscillator of claim 3 wherein said semiconductor material is germanium.

5. The oscillator of claim 4 wherein said particular direction is the (100) direction in germanium.

6. The oscillator of claim 4 wherein said voltage value $V_2$ is below the voltage at which avalanche injection is produced in said germanium body.

7. The oscillator of claim 3 wherein said load means includes reactance to provide a circuit which is resonant at a frequency above $10^8$ cycles per second.

8. The microwave oscillator of claim 3 wherein said semiconductor body has an essentially uniform cross section perpendicular to the direction in which the voltage is applied.

9. An oscillator circuit comprising:

(a) a body of semiconductor material having an excess of charge carriers of one conductivity type;

(b) said semiconductor body normally having a number of low energy valleys in which said excess charge carriers are located;

(c) said semiconductor body including means responsive when a voltage above a saturation voltage is applied across said body in a particular direction which is symmetrical relative to said low energy valleys to exhibit saturation in the drift velocity of the excess charge carriers;

(d) said semiconductor body presenting a bulk negative differential conductivity and a high frequency current instability when the voltage applied is in a range in which the drift velocity of the excess charge carriers decreases with increasing applied voltage;

(e) noninjecting ohmic connections made to said body and voltage means coupled to said connections for applying the said voltage in the range which produces said bulk negative differential conductivity in said body;

(f) said applied voltage being less than the voltage necessary to produce avalanche breakdown in the body;

(g) and load means coupled to said body for providing a high frequency output for said oscillator circuit.

10. The oscillator circuit of claim 9 wherein said semiconductor material is germanium.

11. The oscillator circuit of claim 10 wherein said voltage is applied along a (100) direction in said germanium.

12. A semiconductor circuit comprising:

(a) a body of germanium;

(b) a pair of noninjecting connections made with two surfaces of said germanium body which surfaces are perpendicular to a (100) direction in said germanium body;

(c) voltage means connected to said ohmic connections for applying to said body a voltage sufficient to produce a bulk negative differential conductivity and a high frequency instability in said body;

(d) and load means connected to said body of germanium for producing an output in response to the current change produced in said body when said bulk negative differential resistance is produced in said body.

13. The semiconductor circuit of claim 12 wherein high frequency oscillations are produced across said load means and said voltage applied to said body to produce said negative differential conductivity is above the voltage necessary to cause saturation of the carrier drift velocity in said body but below the voltage necessary to cause complete avalanche breakdown to occur in said body.

14. The semiconductor circuit of claim 12 wherein said voltage applied to said body of germanium to produce said bulk negative differential conductivity is ineffective to transfer a significant number of carriers from lower to high energy valleys of different mobility in germanium.

15. A high frequency oscillator comprising:

(a) a body of semiconductor material having an excess of free charge carriers of one conductivity type which are located in a plurality of low energy valleys in said body which are symmetrical with respect to a particular crystalline direction in said body;

(b) means for applying to said body along said crystalline direction an electric field which saturates the drift velocity of the free charge carriers in said low energy valleys without transferring a significant number of the charge carriers to higher energy valleys in which they have a different mobility, said applied electric field producing a bulk negative differential conductivity and a high frequency current instability in said body without producing avalanche breakdown in said body;

(c) and means coupling said body to a load for producing high frequency output oscillations.

References Cited

Ridley et al.: "A Bulk Differential Negative Resistance Due to Electron Tunneling Through An Impurity Potential Barrier," Physics Letters, vol. 4, 1963, pp. 300–302.

ROY LAKE, Primary Examiner

S. H. GRIMM, Assistant Examiner

U.S. Cl. X.R.

307—317; 317—239